(12) United States Patent
Nourbakhsh et al.

(10) Patent No.: US 9,337,273 B2
(45) Date of Patent: May 10, 2016

(54) GRAPHENE-BASED SEMICONDUCTOR DEVICE

(71) Applicants: IMEC, Leuven (BE); Katholieke Universiteit Leuven, K.U.LEUVEN R&D, Leuven (BE)

(72) Inventors: Amirhasan Nourbakhsh, Heverlee (BE); Mirco Cantoro, Leuven (BE); Cedric Huyghebaert, Leuven (BE); Mark Heyns, Linden (BE); Stefan DeGendt, Wijnegem (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 0 days.

(21) Appl. No.: 13/853,572

(22) Filed: Mar. 29, 2013

(65) Prior Publication Data
US 2013/0313522 A1 Nov. 28, 2013

(30) Foreign Application Priority Data

May 23, 2012 (EP) .................................... 12168995

(51) Int. Cl.
| | |
|---|---|
| *H01L 29/06* | (2006.01) |
| *H01L 31/00* | (2006.01) |
| *H01L 29/16* | (2006.01) |
| *H01L 29/778* | (2006.01) |
| *H01L 21/02* | (2006.01) |
| *H01L 51/05* | (2006.01) |
| *H01L 29/49* | (2006.01) |

(Continued)

(52) U.S. Cl.
CPC ...... *H01L 29/1606* (2013.01); *H01L 21/02376* (2013.01); *H01L 29/4908* (2013.01); *H01L 29/778* (2013.01); *H01L 29/78603* (2013.01); *H01L 29/78684* (2013.01); *H01L 29/78696* (2013.01); *H01L 51/0562* (2013.01); *B82Y 40/00* (2013.01); *H01L 21/02527* (2013.01); *H01L 21/02612* (2013.01); *Y10S 977/734* (2013.01)

(58) Field of Classification Search
CPC .......................................................... H01L 29/00
USPC ............................. 257/E29.255, 24, E29.242
See application file for complete search history.

(56) References Cited

U.S. PATENT DOCUMENTS

| | | | |
|---|---|---|---|
| 8,354,296 B2 * | 1/2013 | Dimitrakopoulos et al. | ... 438/99 |
| 8,361,853 B2 * | 1/2013 | Cohen et al. | ... 438/198 |

(Continued)

OTHER PUBLICATIONS

Yan et al. "Formation of Bilayer Bernal Graphene: Layer-by-Layer Epitaxy via Chemical Vaper Deposition", Feb. 15, 2011, ACS Publication (Nano Letters), pp. 1106-1110.*

(Continued)

*Primary Examiner* — Telly Green
(74) *Attorney, Agent, or Firm* — Knobbe Martens Olson & Bear, LLP (57) ABSTRACT

A semiconductor device is provided comprising a bilayer graphene comprising a first and a second adjacent graphene layer, and a first electrically insulating layer contacting the first graphene layer, the first electrically insulating layer comprising an electrically insulating material, and a substance suitable for creating free charge carriers of a first type in the first graphene layer, the semiconductor device further comprising an electrically insulating region contacting the second graphene layer and suitable for creating free charge carriers of a second type, opposite to the first type, in the second graphene layer.

18 Claims, 6 Drawing Sheets

(51) Int. Cl.
*H01L 29/786* (2006.01)
*B82Y 40/00* (2011.01)

(56) References Cited

U.S. PATENT DOCUMENTS

| | | | |
|---|---|---|---|
| 8,440,999 B2* | 5/2013 | Dimitrakopoulos et al. | ... 257/24 |
| 8,592,888 B2* | 11/2013 | Kivioja et al. | ............ 257/318 |
| 8,685,843 B2* | 4/2014 | Li et al. | ............ 438/479 |
| 2011/0068290 A1* | 3/2011 | Haddon et al. | ......... 252/62.51 R |
| 2011/0105293 A1* | 5/2011 | Gordon et al. | ............ 501/1 |
| 2011/0278545 A1 | 11/2011 | Voutilainen et al. | |
| 2011/0291068 A1* | 12/2011 | Kobayashi | ............ 257/9 |
| 2011/0309336 A1 | 12/2011 | Shin et al. | |
| 2012/0085991 A1* | 4/2012 | Cohen et al. | ............ 257/28 |
| 2012/0175594 A1* | 7/2012 | Chen et al. | ............ 257/29 |
| 2012/0181507 A1* | 7/2012 | Dimitrakopoulos et al. | ... 257/29 |
| 2012/0205626 A1* | 8/2012 | Dimitrakopoulos et al. | ... 257/29 |
| 2013/0001515 A1* | 1/2013 | Li et al. | ............ 257/24 |
| 2013/0037780 A1* | 2/2013 | Kivioja et al. | ............ 257/26 |
| 2013/0119350 A1* | 5/2013 | Dimitrakopoulos et al. | ... 257/29 |
| 2013/0203246 A1* | 8/2013 | Dimitrakopoulos et al. | . 438/478 |
| 2014/0021446 A1* | 1/2014 | Lee et al. | ............ 257/29 |

OTHER PUBLICATIONS

Xia et al. "Graphene Field-Effect Transistors with High On/Off Current Ratio and Large Transport Band Gap at Room Temperature", Jan. 21, 2010, American Chemical Society, Nano Letters Oct. 2010, pp. 715-718.*
Guo et al. "Graphene Doping: A Review", Insciences Journal, Apr. 27, 2011, pp. 80-89.*
Bukowska et al., "Raman spectra of graphene exfoliated on insulating crystalline substrates", New Journal of Physics, vol. 13, No. 6, Jun. 9, 2011, p. 64018.
Chen et al., "Charged-impurity scattering in graphene" Nature Physics, vol. 4, May 2008, 377, published online: Apr. 13, 2008; doi:10.1038/nphys935.
Coletti et al., Charge neutrality and band-gap tuning of epitaxial graphene on SiC by molecular doping, Phys Rev B 81, 235401 (2010).
Duong et al. "Band-gap engineering in chemically conjugated bilayer graphene: Ab initio calculations", Physical Review B, vol. 85, No. 20, May 9, 2012, p. 205413.
Farmer et al., "Behavior of a chemically doped graphene junction", Appl. Phys. Lett. 94, 213106 (2009).
Ghosh et al., "NO2 and humidity sensing characteristics of few-layer graphenes", J. Exp. Nanosci. 4, 313 (2009).
Guillaume et al., "Electronic properties and STM images of doped bilayer graphene", Physical Review B 85, 035444 (2012).
Majumdar, et al., "High On-Off Ratio Bilayer Graphene Complementary Field Effect Transistors", 2010 International Electron Devices Meeting—Technical Digest, IEDM10-736, 32.4.1, (2010).
McCann, E., "Asymmetry gap in the electronic band structure of bilayer graphene" Phys Rev B 74, 161403(R) (2006).
Menezes et al., "Gap opening by asymmetric doping in graphene bilayers" Physical Review B 82, 245414 (2010).
Nakada et al., "Edge state in graphene ribbons: Nanometer size effect and edge shape dependence", Phys. Rev. B 54, 17954 (1996).
Nourbakhsh et al., "Tunable n- and p-type doping of single-layer graphene by engineering its interaction with the SiO2 support", Physica Status Solidi. Rapid Research Letters, Wiley V C H Verlag, DE, vol. 6, No. 2, Feb. 1, 2012, pp. 53-55.
Park et al., "Single-Gate Bandgap Opening of Bilayer Graphene by Dual Molecular Doping", *Adv. Mater.* Dec. 12, 2011, 24, 407-411.
Sano et al. "Bandgap Engineering of Bilayer Graphene for Field-Effect Transistor Channels", Japanese Journal of Applied Physics, vol. 48, No. 9, Part, 1, Sep. 1, 2009, pp. 91605-1-91605-3.
Szafranek et al., "High On/Off Ratios in Bilayer Graphene Field Effect Transistors Realized by Surface Dopants", | Nano Lett. Nov. 2011, 2640-2643, dx.doi.org/10.1021/nl200631m.
Szafranek et al., "High On/Off Ratios in Bilayer Graphene Field Effect Transistors Realized by Surface Dopants", | arXiv:1102.4927v1 [cond-mat.mtrl-sci] Feb. 24, 2011.
Tian et al., "Band Gap Opening of Bilayer Graphene by F4-TCNQ Molecular Doping and Externally Applied Electric Field", *J. Phys. Chem. B* 2010, 114, 11377-11381.
Yu et al. "Toward Tunable Band Gap and Tunable Dirac Point in Bilayer Graphene with Molecular Doping", Nano Lett. Nov. 2011, 4759-4763, dx.doi.org/10.1021/nl2025739.
Zhang et al. "Direct observation of a widely tunable bandgap in bilayer graphene", Nature, vol. 459, Jun. 11, 2009, doi:10.1038/nature08105.
Zhang et al. "Opening an Electrical Band Gap of Bilayer Graphene with Molecular Doping", ACS Nano vol. 5, No. 9, 7517-7524 (2011), online publication of ACS Nano 10.1021/nn202463g, American Chemical Society, (2001).

* cited by examiner

GRAPHENE-BASED SEMICONDUCTOR DEVICE

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of European Application No. EP 12168995.4 filed on May 23, 2012, the disclosure of which is hereby expressly incorporated by reference in its entirety and is hereby expressly made a portion of this application.

TECHNICAL FIELD

The present disclosure relates to semiconductor devices comprising a bilayer graphene as well as to method for the manufacturing thereof. In particular, the present disclosure relates to field effect transistors.

BACKGROUND

Graphene is a 2-dimensional, semi-metallic, atomically-thin film in which carbon atoms are arranged into a $sp^2$ honeycomb lattice structurally relying on in-plane, covalent σ-bonds. It has been successfully isolated for the first time in 2004 at the University of Manchester by A. K. Geim, K. S. Novoselov and his co-workers, by micromechanically exfoliating graphite crystals on top of $Si/SiO_2$ film stacks. Significant breakthroughs in graphene applied research have been achieved: switching behaviors with $f_T$ in excess of hundreds GHz, high frequency photodetectors for high speed (10 Gb/s) optical communications, single molecule detectors, and high mobility transistors (~$10^5$ $cm^2V^{-1}s^-$). It is also chemically stable in non-oxidizing environments, and is mechanically very stiff. Its electronic transport properties have been found to be largely superior to those of materials traditionally employed in microelectronics. Therefore, graphene is one of the most promising candidates as material for post-CMOS applications.

Single layer graphene (SLG) is a bandgap-free semimetal. As a consequence, transistors using SLG as active channel exhibit a poor Ion/Ioff (generally ~10), and cannot be switched off. This is one of the main limiting factors hampering the use of graphene in microelectronics for logic applications. To solve this problem, a bandgap would be required in SLG. A number of approaches have been pursued to induce bandgap opening in SLG; for example, when SLG is tailored in few nm-wide ribbons, a quantum confinement-induced bandgap appears (K. Nakada et al., Phys. Rev. B 54, 17954 (1996)).

Figure 1:
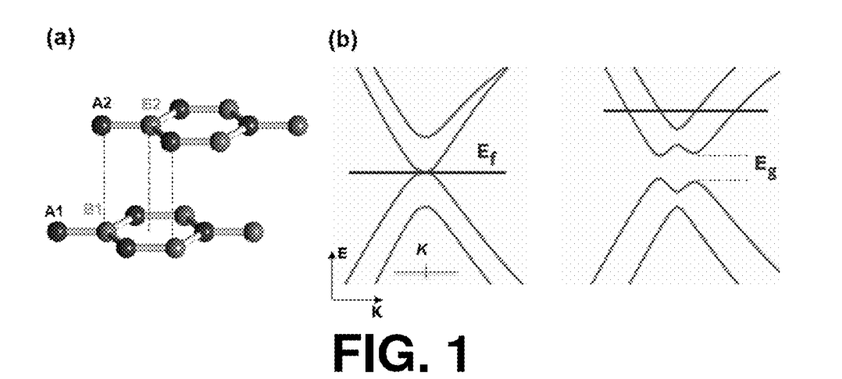
FIG. 1 shows (a) a schematic representation of the Bernal stacking in bilayer graphene; (b) the electronic band structure of pristine bilayer graphene; and (c) the electronic band structure of gated bilayer graphene.

A radically different approach can be pursued by using bilayer graphene (BLG) (E. McCann, Phys Rev B 74, (2006)). BLG—which consists of two SLG stacked vertically and interacting via their pi-bonds—shares with SLG the zero bandgap character and is therefore a semimetal too (see FIG. 1(b) (left)). However, a bandgap can be introduced in BLG if the inversion symmetry of the two stacked layers is broken by the use of an external electric field, applied perpendicularly to the BLG plane (see FIG. 1(b) (right)). BLG then becomes a semiconductor with a bandgap that depends on the strength of the applied electric field. The maximum value of the bandgap that can be induced depends solely on interlayer coupling energy. So far, the bandgap opening in BLG by vertical symmetry breaking, as described above, has been achieved in two main flavors:

(i) Electric Displacement Field Generated by a Gate Electrode:

In this method, an external gate stack in direct contact with BLG (e.g. a top gate stack) is used to establish an electric displacement field perpendicular to the BLG plane. The field induces two different excess charge densities on the two layers of BLG, thus inducing a charge density asymmetry between the two layers (E. McCann, Phys Rev B 74, (2006)). The Coulomb interaction between the two asymmetric charges causes the opening of a bandgap between the conductance and valence energy bands in the BLG band diagram. An optical bandgap of 250 meV has been measured by infra-red spectroscopy (F. Wang et al., Nature 459, 820 (2009)). A bandgap of at least 300 meV would however be needed to achieve an $I_{on}/I_{off}$ in excess of $10^4$ (K. Majumdar, et al., 2010 International Electron Devices Meeting—Technical Digest, (2010)) required to allow for efficient switching of BLG-based transistors at room temperature. In order to achieve a 300 meV bandgap, the applied electric field has to be larger than 3.5 V/nm. On the other hand, when one applies such a high electric field across BLG, the charge density in BLG exceeds $10^{13}$ $cm^{-2}$. Therefore, to switch off the transistor, the primary gate must generate a very high electric displacement field to compensate the excess charge and put the Fermi level into the bandgap which may reach the break-down voltage of the $SiO_2$ dielectric.

(II) Opening Up of a Bandgap in BLG by Adsorbates:

In this method, the top layer of BLG is doped by the physisorption of atoms or molecules. Being a strictly 2D material, graphene is extremely sensitive to adsorbates and other molecules in direct contact with its surface. This property can be exploited to tailor the electronic properties of graphene. Literature reports on various examples of adsorbed species, ranging from metals and adatoms (J. H. Chen et al. Nat Phys 4, 377 (2008)), to organic compounds (C. Coletti et al., Phys Rev B 81, (2010)), inorganic salts (D. B. Farmer et al., Appl Phys Lett 94, (2009)), and gases (A. Ghosh, J. Exp. Nanosci. 4, 313 (2009)). Each of these species can provide either n- or p-type doping in graphene, depending on the difference in the electronegativity between graphene and the adsorbate. When considering BLG, an effective electric field can be induced by placing excess charge on the top layer, resulting in charge redistribution and asymmetry between top and bottom layers. Doping BLG by chemical physisorption resembles the effect of an external gating. So far, the opening of a bandgap in BLG via physisorption has been performed by using metal adatoms deposited on top of BLG, such as potassium and aluminum (B. N. Szafranek et al., Nano Lett 11, 2640 (2011)), by evaporation of organic molecules (C. Coletti, et al., Phys Rev B 81, (2010), and also by doping with oxygen or even moisture C.-T. L. Wenjing Zhang et al., Acs Nano 5, 7517 (2011)). However, the doping approaches listed above are not easily controlled as the dopants tend to spread non-uniformly on the BLG. Furthermore, the dopant tends to migrate and interact with graphene, creating defects. This migration also tends to favor the formation of aggregates over time, leading to device performance stability problems. Also, the deposition of dopants is so far hardly compatible with typical CMOS process flows.

SUMMARY OF THE DISCLOSURE

There is therefore a need in the art for new BLG architectures helping achieving an electric displacement field larger than 3.5 V/nm across the bilayer. There is also a need in the art for an architecture having a low impact on the structural integrity of graphene and on the stability of the device.

It is an aim of the present disclosure to provide a graphene bilayer-based semiconductor device having efficient switching.

This aim is achieved according to the disclosure with a semiconductor device showing the technical characteristics of the first independent claim.

It is another aim of the present disclosure to provide a method for manufacturing such a semiconductor device.

This aim is achieved according to the disclosure with a method comprising the steps of the second independent claim.

It is an advantage of embodiments of the present disclosure that a graphene bilayer-based semiconductor device can be obtained that exhibits a good $I_{on}/I_{off}$ ratio (e.g. $10^4$ or more).

It is an advantage of embodiments of the present disclosure that a graphene bilayer-based semiconductor device can be obtained that can be effectively switched off via a relatively low change in the electric displacement field.

It is an advantage of embodiments of the present disclosure that a graphene bilayer-based semiconductor device can be obtained that exhibit a permanent band-gap of at least 100 meV in absence of external potential applied at a top and/or bottom gate and a bandgap of at least 300 meV in presence of such an external potential.

It is an advantage of embodiments of the present disclosure that a graphene bilayer-based semiconductor device can be obtained that can exhibit a bandgap of at least 300 meV via the application of an electric field smaller than 3.5 V/nm.

It is an advantage of embodiments of the present disclosure that a graphene bilayer-based semiconductor device can be obtained that exhibit a charge density in the bilayer graphene below $10^{13}$ cm$^{-2}$, thereby permitting the switching off of the device via a relatively low external electric displacement field.

It is an advantage of embodiments of the present disclosure that a graphene bilayer-based semiconductor device can be obtained wherein the doping level of the bilayer graphene can be easily controlled.

It is an advantage of embodiments of the present disclosure that a graphene bilayer-based semiconductor device can be obtained wherein the doping on the bilayer graphene can be uniform.

It is an advantage of embodiments of the present disclosure that a graphene bilayer-based semiconductor device can be obtained wherein the dopants used to dope the bilayer graphene do not migrate within the bilayer graphene, thereby creating defects.

It is an advantage of embodiments of the present disclosure that a graphene bilayer-based semiconductor device can be obtained wherein the dopants used to dope the bilayer graphene do not aggregate.

It is an advantage of embodiments of the present disclosure that a graphene bilayer-based semiconductor device can be obtained via a method compatible with typical CMOS process flows.

It is an advantage of embodiments of the present disclosure that a graphene bilayer-based semiconductor device can be obtained which is passivated and/or which permits gating of the device (in particular, gating of the top layer of the device).

It is an advantage of embodiments of the present disclosure that a graphene bilayer-based semiconductor device can be obtained via a method enabling good control of the dopant concentration.

In a first aspect, the present disclosure relates to a semiconductor device comprising: a bilayer graphene comprising a first and a second adjacent graphene layer, and means for opening up a bandgap in said bilayer graphene.

In embodiments, said bandgap may be of at least 100 meV.

In an embodiment of the first aspect, said means may comprise: a first electrically insulating layer on top of said bilayer graphene, comprising: an electrically insulating material, and a substance suitable for creating free charge carriers of a first type in said first graphene layer, and an electrically insulating region underneath said second graphene layer and suitable for creating free charge carriers of a second type, opposite to said first type, in said second graphene layer.

In a preferred embodiment of the first aspect, the present disclosure relates to a semiconductor device comprising: a bilayer graphene comprising a first and a second adjacent graphene layer, a first electrically insulating layer contacting said first graphene layer, said first electrically insulating layer comprising: an electrically insulating material, and a substance suitable for creating free charge carriers of a first type in said first graphene layer, and an electrically insulating region contacting said second graphene layer and suitable for creating free charge carriers of a second type, opposite to said first type, in said second graphene layer.

By having said first electrically insulating layer contacting said first graphene layer while having said electrically insulating region contacting said second graphene layer, one achieves a symmetrical distribution of the substances suitable for creating free charge carriers on both sides of the bilayer graphene. This permits to achieve a low charge density in the graphene bilayer.

While directly deposition of said substance suitable for creating free charge carriers of a first type on the bilayer would: lead to problems of inhomogeneous distribution of said substance on its side on the bilayer graphene, lead to diffusion of said substance into the bilayer graphene, and prevent the gating of the device, incorporating said substance in an electrically insulating layer permits to solve all these problems at once. Furthermore, the low charge density in the graphene bilayer couple to the presence of the insulating material permitting the gating of the device enables: achieving an electric field sufficient to open a bandgap large enough for efficient device switching, by imposing a displacement field, and permitting the switching off of the transistor via a relatively low change in the electric displacement field.

A further advantage of the first electrically insulating layer is the passivation of the device, protecting it against e.g. oxidation.

In embodiments, the insulating region may be the electrically insulating part of a substrate comprising an electrically conductive part (e.g. a doped Si-wafer) and an electrically insulating part (herein named "second" insulating layer, e.g. a high-k dielectric such as $Al_2O_3$ or $HfO_2$), wherein said electrically insulating part is bound to a dopant layer suitable for creating said free charge carriers of a second type in said second graphene layer. The electrically conductive part is an example of a second electrode as referred to herebelow.

In any embodiment herein, expressions relating to a substance suitable for creating free charge carriers in a graphene layer can be replaced by expressions relating to a substance suitable for doping said graphene layer. Similarly, expression relating to a substance suitable for creating free charge carriers in a graphene layer can be replaced by expressions relating to a substance suitable for changing the level of the conduction band and/or the valence band of the graphene bilayer.

For instance, in an embodiment of the first aspect, the present disclosure may relate to a semiconductor device comprising: a bilayer graphene comprising a first and a second adjacent graphene layer, a first electrically insulating layer contacting said first graphene layer, said first electrically insulating layer comprising: an electrically insulating material, and a substance suitable for doping positively (or in the alternative, negatively) said first graphene layer, and an electrically insulating region contacting said second graphene layer and suitable for doping negatively (or in the alternative, positively) said second graphene layer.

As another example of embodiment of the first aspect, the present disclosure may relate to a semiconductor device comprising: a bilayer graphene comprising a first and a second adjacent graphene layer, a first electrically insulating layer contacting said first graphene layer, said first electrically insulating layer comprising: an electrically insulating material, and a substance suitable for changing the conduction band level and/or the valence band level of the graphene bilayer, and an electrically insulating region contacting said second graphene layer and suitable for changing the conduction band level and/or the valence band level of the graphene bilayer.

In embodiments, the bilayer graphene may be Bernal stacked (see FIG. 1 (a)). A Bernal stacked bilayer graphene has half the atoms in one layer lying atop half the atoms in the other. This configuration is advantageous because it enables the control of the difference between the onsite energy of B1-A2 sites (see FIG. 1(a)) electrostatically by inducing a sufficiently strong electric field between layers. In the presence of such a field a band-gap opens between conduction and valance bands.

In embodiments of the first aspect, said electrically insulating material may be suitable for forming a homogeneous film and is preferably a polymer. The suitability for forming a homogeneous film is advantageous as it assures a complete coverage of the graphene bilayer, thereby insulating electrically and passivating one side of said first graphene layer. This insulation permits the device to be gated, i.e. it permits to place an electrode on top of the first electrically insulating layer. The passivation extends the device's lifetime and electrical stability. Another advantage of an insulating material suitable for forming a homogeneous film is that a substance can be homogeneously dispersed therein. When this substance is suitable for creating free charge carriers of a first type in said first graphene layer, it permits said free charge carriers to be homogeneously created across the entire surface of the first graphene layer. This minimizes local excess of free charge carriers. Polymers are materials that can easily be selected to fulfill both requirements (insulating and film forming); however other materials can be used for the same purpose. For instance, non-crystallizing small molecules, non-crystallizing oligomers, and waxes can be used. By small molecules, it is meant molecules not being polymers. A further advantage of the use of a mixture insulating material/substance is that it permits good control of substance concentration.

In embodiments of the first aspect, the electrically insulating material may be said substance. For instance, the electrically insulating material may be a graphene oxide layer or any other insulating material capable to create free charge carriers in the first graphene layer. In the case of the graphene oxide layer, oxygen is electron withdrawing and therefore creates holes (positive free charge carriers) in the first graphene layer.

In other embodiments of the first aspect, the electrically insulating material may be bound to said substance. In this embodiment, the electrically insulating material is attached to said substance. For instance, the substance may be covalently bound to the polymer as pending groups and/or as end-groups. Having the insulating material bound to the substance has the advantage of avoiding phase separation of the insulating material and the substance. Such phase separation leads to aggregation of the substance which has a detrimental effect on its properties. Furthermore, having the insulating material bound to the substance has the advantage of avoiding migration of the substance from the electronically insulating layer into the bilayer graphene.

In yet other embodiments of the first aspect, the electrically insulating material may be a matrix within which said substance is dispersed. This embodiment is typically sufficient to prevent migration of the substance into the bilayer graphene. Furthermore, it assures a good homogeneity of the substance in the electrically insulating layer. Moreover, it is an easily implemented embodiment since it typically only involves the preparation of a solution of said electrically insulating material and said substance in an appropriate solvent. Such an embodiment is compatible with typical CMOS process flows. And last but not least, it permits the gating of the device.

By dispersing the substance in a matrix such as a polymer matrix, part of the substance will end up at the interface between the matrix and the first graphene layer. This interfacial substance is chiefly responsible for the free charge carrier formation in the first graphene layer. The amount of interfacial substance is proportional to the concentration of substance in the electrically insulating layer. As a result, the doping level is directly proportional to the concentration of said substance in said electrically insulating layer.

In embodiments of the first aspect, the semiconductor device may further comprise a first electrode coupled to said first electrically insulating layer, and/or a second electrode coupled to said electrically insulating region. Such a gating of the semiconductor device is advantageous because it permits: achieving an electric field sufficient to open a bandgap large enough for efficient device switching, by imposing a displacement field, and permitting the switching off of the device via a relatively low change in the electric displacement field.

In embodiments of the first aspect, said electrically insulating material may be chemically inert toward graphene.

In embodiments of the first aspect, said first electrically insulating layer may be a graphene oxide layer. A graphene oxide layer fulfills all functions expected from the first electrically insulating layer since 1) it is insulating, 2) it is homogeneously oxidized and therefore homogeneously creates free charge carriers across the first layer of the bilayer graphene, and 3) since the graphene oxide layer is by itself both the electrically insulating material and the free charge carriers creating substance, there is no risk of migration of charge carriers creating substance into the bilayer graphene. A graphene oxide layer on top of a bilayer graphene can be obtained by exposing a trilayer graphene to an oxygen atmosphere.

In embodiments of the first aspect, said electrically insulating region may have a relative permittivity of at least 3.9. This is advantageous since, the higher the relative permittivity, the higher is the displacement field that can be obtained, thereby permitting a sufficient opening of the bandgap and a good switch off of the device.

In embodiments of the first aspect, said electrically insulating region may comprise a second electrically insulating layer bound to a dopant layer suitable for creating said free charge carriers of a second type in said second graphene layer.

In embodiments of the first aspect, said dopant layer may be a monolayer of molecules comprising electron donating or withdrawing groups suitable for creating said free charge carriers of a second type in said second graphene layer. In embodiments, said molecules may be grafted onto said second insulating layer. As an example, said molecules can be of the kind able to form a monolayer on the insulating layer. A suitable example is a molecule having a first functional group suitable for reacting on said insulating layer, a second functional group suitable for donating or withdrawing electrons from the second layer of the bilayer graphene and a linker between said first functional group and said second functional group. Said first functional group is typically —SiCl$_3$ or —Si(OR)$_3$ with R being selected from methyl (preferred), ethyl and propyl. Said second functional group can for instance be a primary amino group. Primary amino groups act as suitable electron donors. The linker is typically a hydrocarbon chain, an oligo ethylene oxide chain, a phenylene, a perfluorated hydrocarbon chain or a combination thereof. The linker can for instance comprise one or more of the following repeat units —(CH$_2$)—, —(C$_6$H$_4$)—, —(CH$_2$CH$_2$O)—, and —(CF$_2$)—. For instance, the number of carbons in the linker can be from 1 to 22. A particular example is a propyl linker. A particular example of suitable molecule is 3-aminopropyl triethoxysilane.

In embodiments, said electrically insulating region may be a second electrically insulating layer defined like the first electrically insulating layer is defined in any embodiment herein, but wherein it is contacting said second graphene layer and not said first graphene layer, and wherein said second electrically insulating layer comprises a substance suitable for creating free charge carriers of a second type in said second graphene layer instead of a substance suitable for creating free charge carriers of a first type in the first graphene layer.

In embodiments of the first aspect, said free charge carriers of a first type may be either electrons or holes and said free charge carriers of a second type may be holes or electrons respectively.

In embodiments of the first aspect, said free charge carriers of a first type may be electrons and said free charge carriers of a second type may be holes.

In embodiments of the first aspect, said electrically insulating material may have a relative permittivity (e.g. at 20° C.) of at least 2.3, preferably at least 4.0 and more preferably at least 10. This is advantageous since, the higher the relative permittivity, the higher is the displacement field that can be obtained. This in turn means that a high electric displacement field can be applied by a relatively smaller gate voltage, thereby permitting a sufficient opening of the bandgap and a good switch off of the device. For instance, polystyrene is suitable but polymers with higher dielectric constants such as high-k fluoropolymers are preferred.

In embodiments of the first aspect, said polymer may be a fluoropolymer. Fluoropolymers have the advantages to be relatively chemically inert and to present a high dielectric constant.

Preferably, said fluoropolymer is a high-k fluoropolymer. Examples of such polymers are poly(trifluoroethylene), poly(vinylidene fluoride) and poly(vinylidene fluoride-trifluoroethylene) amongst others.

In embodiments of the first aspect, said substance may represent from 1 wt. % to 10 wt. % of the electrically insulating layer. This amount is advantageous as it permits to assure a sufficient concentration of substance to permit enough free charge carriers creation. It is also advantageous because higher loads tend to reduce the dielectric constant of the first electrically insulating layer. Furthermore, a higher concentration of substance increases the likelihood of substance aggregation, which is detrimental to the free charge carrier creation properties of the substance.

In embodiments of the first aspect, the semiconductor device may further comprise a source electrode, a drain electrode, and a channel between said source and drain electrodes, wherein said channel is said bilayer graphene, said semiconductor device being a field effect transistor.

In embodiments of the first aspect, said electrically insulating material may be a matrix within which said substance is dispersed and wherein said substance is selected from the p-dopant tetrafluoro-tetracyanoquinodimethane (F4-TCNQ), the p-dopant 2,2'-(perfluoronaphthalene-2,6-diylidene)dimalononitrile (F6-TCNNQ) and the n-dopant aminoethoxy ethanol.

In a second aspect, the present disclosure relates to a method for manufacturing a semiconductor device according to any one of the preceding claims, comprising the steps of: providing an electrically insulating region suitable for creating free charge carriers of a second type, opposite to a first type, in a second graphene layer, depositing a bilayer graphene, comprising a first and said second graphene layer, above said electrically insulating region, and depositing an electrically insulating layer on said bilayer graphene, said electrically insulating layer comprising an electrically insulating material and a substance suitable for creating free charge carriers of said first type in said first graphene layer.

In an embodiment, providing an insulating region suitable for creating free charge carriers of a second type may comprise the steps of: providing a substrate comprising an electrically conductive part (e.g. a doped Si-wafer) and an electrically insulating part (herein named "second" insulating layer, e.g. a high-k dielectric such as Al$_2$O$_3$ or HfO$_2$), providing a dopant layer (e.g. a SAM of an amine-terminated silane) on said electrically insulating part, said dopant layer being suitable for creating said free charge carriers of a second type.

In embodiments, an annealing step may be performed at a temperature (e.g. from 100 to 150° C.) and for a time (e.g. from 1 h to 5 h) suitable to trigger interaction of the second graphene layer with the underlying dopant (e.g. —NH$_2$ amino groups).

In embodiments, when the second substance is amino groups, these groups can be deprotonated via an adequate basic treatment.

In an embodiment of the second aspect, the present disclosure relates to a method for manufacturing a field effect transistor, comprising the steps of: providing a substrate comprising an electrically conductive part (herein named "second electrode") and an electrically insulating part (herein named "second" insulating layer), providing a dopant layer on said electrically insulating part, said dopant layer being suitable for creating said free charge carriers of a second type, opposite to a first type, in a second graphene layer, depositing a bilayer graphene, comprising a first and said second graphene layer, above said electrically insulating region, said bilayer graphene forming a channel, Creating a source and a drain electrode on said substrate, said source and drain electrodes being connected via said channel, depositing an electrically insulating layer (herein called "first insulating layer" on said bilayer graphene, said electrically insulating layer comprising an electrically insulating material and a substance suitable for creating free charge carriers of said first type in said first graphene layer, providing an electrode (herein named "first electrode" on said electrically insulating layer.

BRIEF DESCRIPTION OF THE DRAWINGS

The disclosure will be further elucidated by means of the following description and the appended figures.

DETAILED DESCRIPTION OF PREFERRED EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

EXAMPLES

Example 1

Preparation of a Field-Effect Transistor Using an Electrically Insulating Layer Comprising Polystyrene and a p-Dopant Substrate Preparation:

Substrates consisting of Si wafers (12, see FIG. 2) with 300 nm thermally grown Si oxide were cleaned for 10 min in a 1:1:5 $NH_4OH:H_2O_2:H_2O$ solution (75° C.) to remove contaminants.

Substrate silanization was then carried out by vertically dipping the substrate in a 0.5% vol. 3-aminopropyl triethoxysilane solution (APTES) in anhydrous toluene for 1 h, rinsing well with toluene and sonicating in isopropanol to remove noncovalently bonded silane molecules. A self assembled monolayer (SAM, 10 see FIG. 2) was thereby obtained.

The sample was then further annealed under $N_2$ atmosphere at 120° C. to improve the quality of SAM.

Graphene Deposition:

Samples bearing a single layer graphene and samples bearing a bilayer graphene were prepared. For this purpose, SLG and BLG were respectively deposited on silanized substrates by micromechanical exfoliation from a natural graphite crystal.

The samples were then annealed at 120° C. for 3 h to trigger interaction of SLG with the underlying —$NH_2$ amino groups.

SLG-FET Fabrication and Characterization:

Source (S, see FIG. 2) and drain (D, see FIG. 2) electrodes were defined by optical lithography, using photoresist IX-450, followed by liftoff metallization (Au 70 nm).

Figure 3:
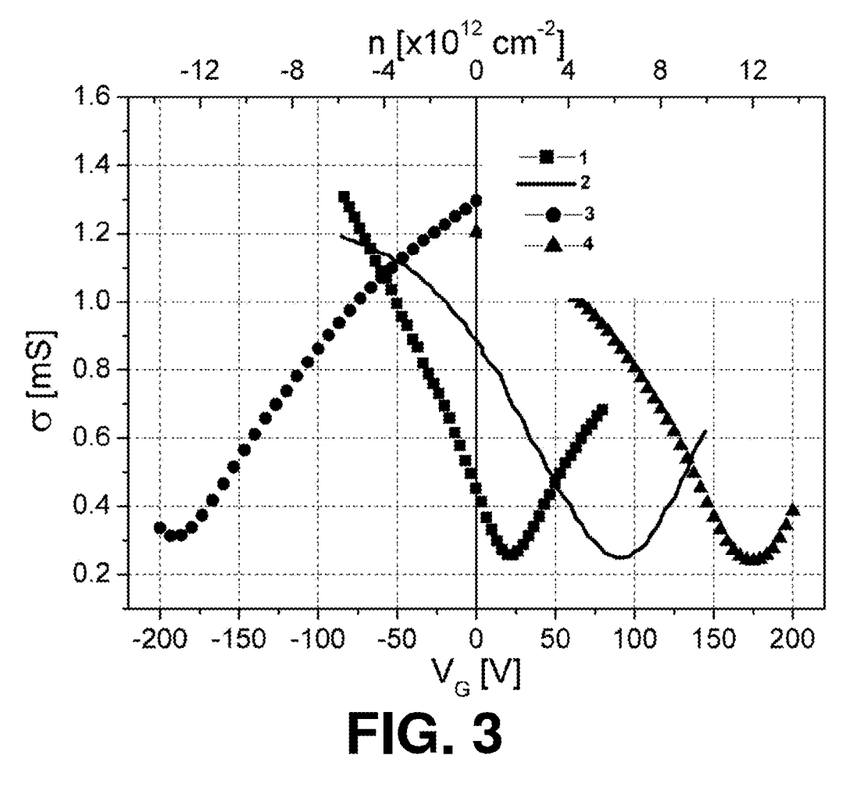
FIG. 3 shows the transfer characteristics of single layer graphene FETs on variously treated substrates.

FIG. 3 compares the transfer characteristics, viz. conductance (σ) vs. back-gate electric field ($V_G$), of SLG-FETs fabricated on pristine (black squares, line no 1) and silanized Si/$SiO_2$ substrates (lines no 2 to 4). The SLG-FET fabricated on a pristine substrate exhibited ambipolar characteristics with a similar increase in conductance at positive and negative field. The SLG-FET fabricated on an amine-treated (but not yet alkaline treated, thick plain line no 2) substrate exhibited a shift of the curve toward more positive fields. This was evidence of the presence of excess holes in the SLG layer.

Without being bound by theory, the following explanation is proposed: The photoresist generated protons upon exposure to light, during device definition by optical lithography. The photoacid positive species protonated the —$NH_2$ groups to —$NH_3^+$ and therefore induced excess holes in graphene.

Literature reports that a surface treated by APTES protonates at pH levels below 10, (S. Auvray et al., Nano Lett 5, 451 (2005)) therefore even pure water, can generate excess protons. So, SLG-FET fabricated on a silanized substrate shows a large positive shift of the neutrality point.

In order to achieve n-doping (circles, line no 3), the surface was deprotonated by immersing the SLG-FETs in an alkaline (pH~12) solution of tetramethylammonium hydroxide (TMAH) in isopropanol for 10 min, followed by rinsing in acetone (45° C.), isopropanol (45° C.), and annealing at 120° C. for 2 h. As shown in FIG. 3 (circles, line no 3), the deprotonation procedure shifted the neutrality point towards negative values.

In order to achieve p-doping (triangles, line no 4), the surface was protonated by immersing the SLG-FETs in an acidic solution.

Preparation of Polymer/$F_4$TCNQ Blends:

The solutions for processing were prepared by dissolving 4.0 mg of polystyrene in 1 ml toluene for a pure inert polymer layer.

The 0.1:4.0 blend was prepared by adding 0.1 mg $F_4$TCNQ to 4.0 mg polystyrene dissolved in 1 ml toluene. Similarly, 0.2:4.0, 0.3:4.0 ratios were prepared.

Each one of these blends was individually spin coated on the BLG-FET and then the device was electrically characterized.

Before spin coating a new blend, the previous layer was removed by a washing step in toluene (1 h) and then the device was rinsed with acetone and isopropanol (10:30 min) followed by immersing in the solution of TMAH/isopropanol (5 min) to fully recover the —$NH_2$ density and finally rinsed in acetone (45° C.), isopropanol (45° C.), and annealing at 120° C. for 2 h.

Figure 4:
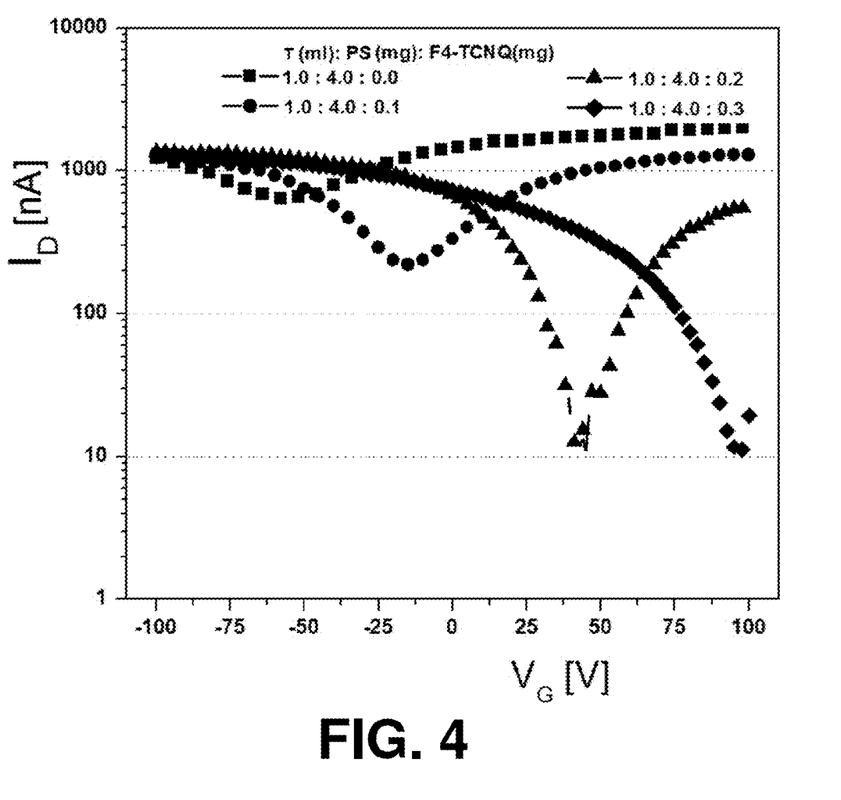
FIG. 4 shows the room temperature transfer characteristics of bilayer graphene FETs coated with a polystyrene/$F_4TCNQ$ blends wherein the concentration of F4TCNQ is varied.

BLG-FET Characterization:

FIG. 4 shows the transfer characteristics of BLG-FET (Length/Width=2) at room temperature.

Back-gate dielectric stack consists of $Si^+$ wafer/300 nm $SiO_2$.

Each curve corresponds to one of the blend concentrations mentioned above.

In each curve, the back-gate bias was swept from −100 to 100 volts.

The source was grounded and the drain bias was kept at 2 mV.

The neutrality point of the device (VNP: where current is minimum) with undoped film (0.0:4.0) was at negative gate voltage which indicates excess electrons in BLG due to interaction with —$NH_2$ terminated substrate.

Upon increasing the $F_4$TCNQ concentration, VNP shifted to more positive gate voltages also, the current at VNP decreases exponentially with the dopant concentration.

The on/off current ratio was defined as the maximum current modulation at the optimum back gate voltage (+100 V if VNP<0 and −100 V if VNP>0)

The device with a non-doped film (0.0:4.0) had an on/off ratio of ~3 which enhanced to ~130 for the maximum tested dopant concentration.

Simulation Test:

Density functional calculations (DFT) were carried out on this specific configuration in order to better understand the doping role of $F_4$-TCNQ.

Interaction of graphene with $F_4$-TCNQ led to partial charge transfer from graphene to the molecule.

Figure 5:
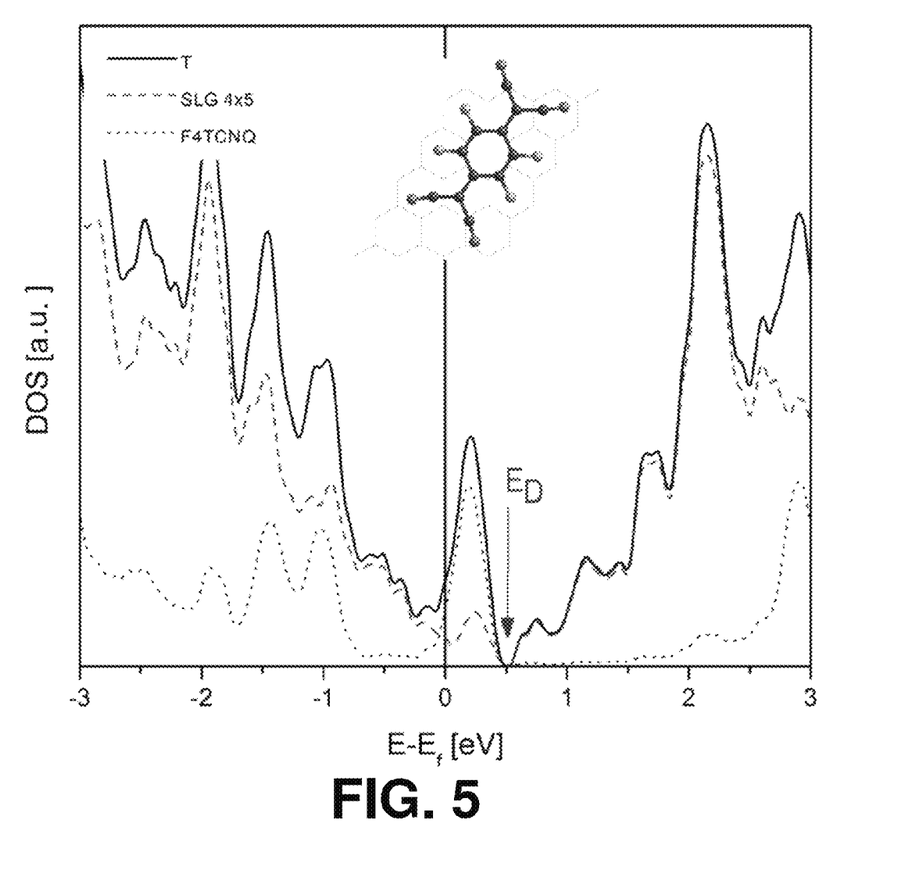
FIG. 5 shows total density of state (DOS) and its projection (PDOS) on the graphene state and PDOS on the $F_4TCNQ$ state for $F_4TCNQ$ on single layer graphene with 4×5 arrangement.

FIG. 5 shows the total density of states (DOS) for $F_4$-TCNQ-SLG with the projection of the DOS (PDOS) onto SLG and $F_4$-TCNQ components in 3 eV vicinity of the Fermi energy (EF).

The Dirac energy point (ED: where the DOS is zero) is located approximately 0.45 eV above the EF which indicates a great electron withdrawing from graphene of about 0.24 electron per $F_4$-TCNQ molecule.

Both isolated graphene (dashed line) and $F_4$-TCNQ (dotted line) have zero electric dipole moments whereas, the adsorption of $F_4$-TCNQ on SLG (plain line T) led to a net perpendicular moment of 2.3 D, headed towards the SLG surface.

The combination of SLG and the ad-molecules film resembles a uniform dipolar slab of infinite extension with built-in electric field normal to the surface and is capable to produce the same response in graphene as an external electric field does.

Turning to the study of hybrid $F_4$-TCNQ/BLG/$NH_2$—SAM system, in general bottom layer has more electrons concentration than top layer due to being closer to —$NH_2$ groups while the top layer is more hole-populated as a result of close interaction with $F_4$-TCNQ molecules.

This charge redistribution leads to a built-in electric field between BLG layers.

Figure 6:
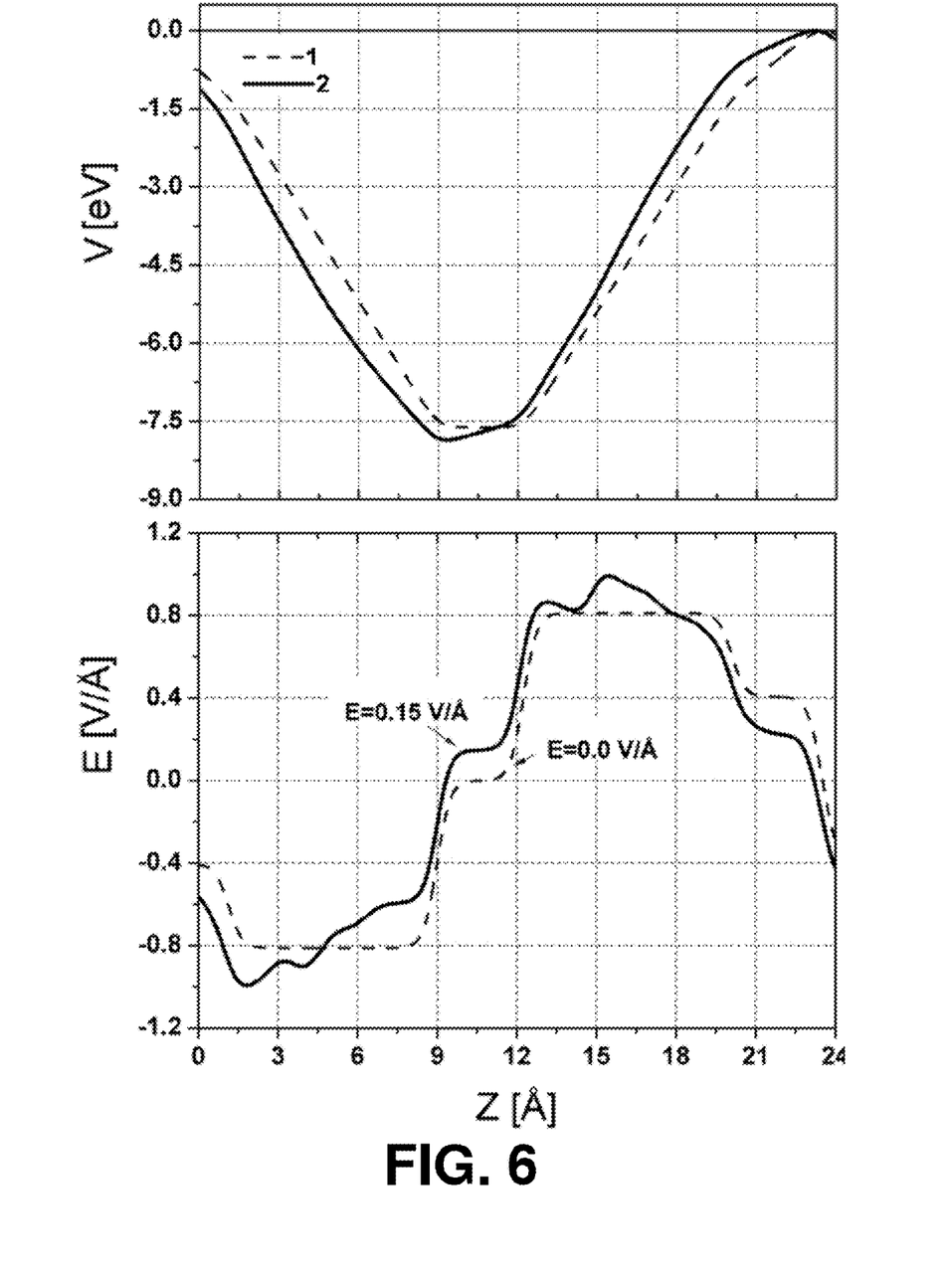
FIG. 6 shows the macroscopic average electrostatic potential (top) and electric field (bottom) arrangement for the isolated bilayer graphene and for hybrid configurations according to embodiments of the present disclosure.

The macroscopic average electroscopic potentials for isolated BLG (dashed line 1) and hybrid system (plain line 2) are plotted in FIG. 6.

For an isolated BLG there is no electrostatic potential difference between layers therefore, as shown in FIG. 6, the potential (V) in the inter-layer space is flat which means that no electric field (E) is set up in this region, while the hybrid configuration shows a smooth linear slope from n-doped bottom layer to the p-doped top layer which leads to a finite built-in electric field between layers.

The first derivative of the curve indicates an electric field of E=1.5 V/nm between the layers which is almost half of the field strength required to achieve the maximum bandgap (300 meV) in BLG.

Example 2

Coupling of a Top Gate Electrode to the Electrically Insulating Layer Comprising Polystyrene and a p-Dopant A top gate electrode is defined on the electrically insulating layer by optical lithography.

This has the advantage over Example 1 to permit an increase of the magnitude of the induced electrical field. Thereby, the device benefits from both external and molecular gates.

Example 3

Preparation of a Field-Effect Transistor (3) Using an Electrically Insulating Layer (5) Comprising a High-k Polymer (6) and a p-Dopant (7), Said Insulating Layer (5) being Coupled to a Top Gate Electrode (11)

Figure 2:
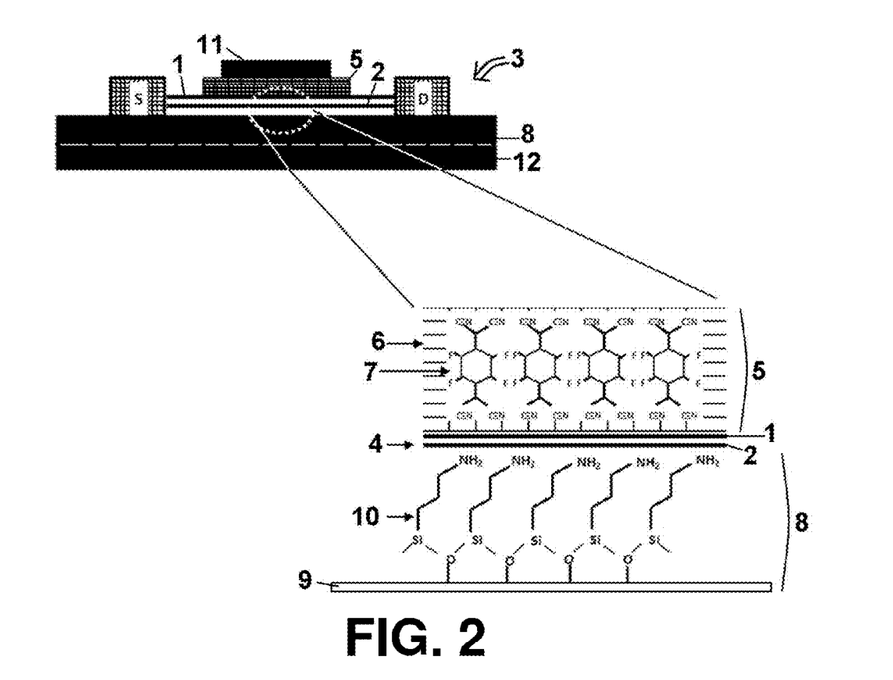
FIG. 2 shows a schematic view of a FET device according to an embodiment of the present disclosure.

Referring to FIG. 2, for the preparation of a field-effect transistor (3) using an electrically insulating layer (5), the same procedure as described in Example 1 is repeated except that in the preparation of the polymer (6)/$F_4$TCNQ (7) blends (5), a high-k polymer (6) (having a relative permittivity of at least 4.0) is used instead of polystyrene. Typically, Poly(trifluoroethylene) or poly(vinylidene fluoride) is used.

Similarly to Example 1, high-k polymer (6)/$F_4$TCNQ (7) blends (5) with different concentrations are prepared and the dielectric constant and break-down voltage of each blend (5) is measured in order to find the optimum concentration of $F_4$TCNQ (7).

For the Coupling of a top gate electrode (11) to the high-k electrically insulating layer (5), the same procedure as described in Example 2 is used.

The presence of the high-k layer (5) in direct contact with the bilayer graphene (4) has the advantage of permitting the inducing of an electric field of higher magnitude, thereby permitting the switching off of the device (3) without reaching the break-down voltage of the insulating layer (5). In FIG. 2, the bilayer graphene (4) is shown as two thick lines with the top line being the first layer (1) of the bilayer (4) and the bottom line (2) being the second layer of the bilayer (4).

Example 4

Preparation of a Field-Effect Transistor (3) Using an Electrically Insulating Layer (5) Comprising a High-k Polymer (6) and a p-Dopant (7), Said Insulating Layer (5) being Coupled to a Top Gate Electrode (11), Said Field Effect Transistor (3) Using an Inorganic High-k Dielectric (9) in the Substrate Preparation Referring to FIG. 2, the same procedure as described in Example 3 is repeated except that the substrate used in the substrate preparation has a high-k inorganic layer (9) instead on the Si oxide layer (9). The high-k inorganic layer (9) is typically $Al_2O_3$ or $HfO_2$.

The substrate comprises a bottom conductive part (12) (which can for instance be a p-doped Si) and a top insulating part (9)

This is advantageous as it permits to achieve larger electric displacement field from the back-gate.

Example 5

Trilayer Graphene Comprising a Native Oxide Layer

Figure 7:
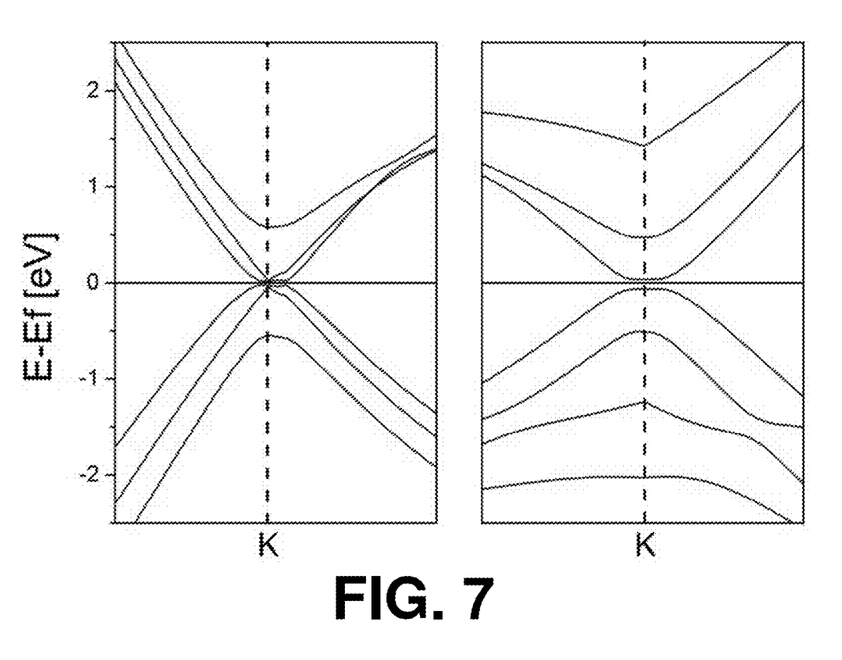
FIG. 7 shows the electronic band structure of pristine trilayer graphene and trilayer graphene wherein the top graphene layer is an oxidized graphene layer.

FIG. 7 compares the band structure of pristine trilayer graphene (TLG) (left) with trilayer graphene comprising a native oxide layer (right). The pristine TLG shows six bands near K point. Four of them touch at Fermi level and two inner bands are about 0.5 eV away from the Fermi level.

In the case of the TLG comprising a native oxide layer, the most inner conduction and valance bands shift to higher energy and leave two pairs of parabolic bands near Fermi level which resembles the energy spectrum of pristine BLG. A TLG comprising a native oxide layer can be considered as a BLG wherein an oxidized further graphene layer contacts the first graphene layer (1) and serves as said first electrically insulating layer (5) contacting the first graphene layer (1). In the present case, the first electrically insulating layer (5) is itself the substance (7) suitable for creating free charge carriers of a first type in said first graphene layer (1).

The above description presents the best mode contemplated for carrying out the present invention, and of the manner and process of making and using it, in such full, clear, concise, and exact terms as to enable any person skilled in the art to which it pertains to make and use this invention. This invention is, however, susceptible to modifications and alternate constructions from that discussed above that are fully equivalent. Consequently, this invention is not limited to the particular embodiments disclosed. On the contrary, this invention covers all modifications and alternate constructions coming within the spirit and scope of the invention as generally expressed by the following claims, which particularly point out and distinctly claim the subject matter of the invention. While the disclosure has been illustrated and described in detail in the drawings and foregoing description, such illustration and description are to be considered illustrative or exemplary and not restrictive.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article 'a' or 'an' does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases 'at least one' and 'one or more' to introduce claim recitations. However, the use of such phrases should not be construed to imply that the introduction of a claim recitation by the indefinite articles 'a' or 'an' limits any particular claim containing such introduced claim recitation to embodiments containing only one such recitation, even when the same claim includes the introductory phrases 'one or more' or 'at least one' and indefinite articles such as 'a' or 'an' (e.g., 'a' and/or 'an' should typically be interpreted to mean 'at least one' or 'one or more'); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of 'two recitations,' without other modifiers, typically means at least two recitations, or two or more recitations). Furthermore, in those instances where a convention analogous to 'at least one of A, B, and C, etc.' is used, in general such a construction is intended in the sense one having skill in the art would understand the convention (e.g., 'a system having at least one of A, B, and C' would include but not be limited to systems that have A alone, B alone, C alone, A and B together, A and C together, B and C together, and/or A, B, and C together, etc.). In those instances where a convention analogous to 'at least one of A, B, or C, etc.' is used, in general such a construction is intended in the sense one having skill in the art would understand the convention (e.g., 'a system having at least one of A, B, or C' would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase 'A or B' will be understood to include the possibilities of 'A' or 'B' or 'A and B.'

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A semiconductor device comprising:
    a bilayer graphene comprising a first graphene layer adjacent to and in contact with a second graphene layer;
    a first electrically insulating layer contacting the first graphene layer, the first electrically insulating layer comprising:
        a first electrically insulating material, and
        a first dopant providing either n-type doping or p-type doping in the first graphene layer,
    wherein the first dopant is dispersed within in the first electrically insulating material; and
    an electrically insulating region contacting the second graphene layer, the electrically insulating region comprising:
        a second electrically insulating material, and
        a second dopant providing, in the second graphene layer, doping of a type opposite to the type of doping provided by the first dopant.

2. The semiconductor device of claim 1, wherein the first electrically insulating material is a homogeneous film.

3. The semiconductor device of claim 2, wherein the first electrically insulating material is a polymer.

4. The semiconductor device of claim 3, wherein the polymer is a fluoropolymer.

5. The semiconductor device of claim 1, wherein the first electrically insulating material is bound to the first dopant.

6. The semiconductor device of claim 1, further comprising a first electrode coupled to the first electrically insulating layer and a second electrode coupled to the electrically insulating region.

7. The semiconductor device of claim 1, wherein the first electrically insulating material is chemically inert toward graphene.

8. The semiconductor device of claim 1, wherein the first electrically insulating layer is a graphene oxide layer.

9. The semiconductor device of claim 1, wherein the electrically insulating region has a relative permittivity of at least 3.9.

10. The semiconductor device of claim 1, wherein the electrically insulating region comprises a second electrically insulating layer bound to a dopant layer, wherein the dopant layer is configured to create the free charge carriers of the second type in the second graphene layer.

11. The semiconductor device of claim 10, wherein the dopant layer is a monolayer of molecules comprising electron donating or withdrawing groups configured for creating the free charge carriers of the second type in the second graphene layer, the molecules being grafted onto the second insulating layer.

12. The semiconductor device of claim 1, wherein the first dopant creates electrons as free charge carriers and the second dopant creates holes as free charge carriers.

13. The semiconductor device of claim 1, wherein the first electrically insulating material has a relative permittivity of at least 2.3.

14. The semiconductor device of claim 1, wherein the first electrically insulating material has a relative permittivity of at least 10.

15. The semiconductor device of claim 1, wherein the first dopant comprises from 1 wt. % to 10 wt. % of the first electrically insulating layer.

16. The semiconductor device of claim 1, further comprising a source electrode, a drain electrode and a channel between the source electrode and the drain electrode, wherein the channel is the bilayer graphene, and wherein the semiconductor device is a field effect transistor.

17. The semiconductor device of claim 1, wherein the first dopant is $F_4$-TCNQ.

18. A method for manufacturing a semiconductor device, comprising:
    providing an electrically insulating region, wherein the electrically insulating region comprises a second electrically insulating material and a second dopant;
    depositing a bilayer graphene above the electrically insulating region, the bilayer graphene comprising a first graphene layer and a second graphene layer; and depositing an electrically insulating layer on the bilayer graphene, the electrically insulating layer comprising a first electrically insulating material and a first dopant dispersed in the first electrically insulating material, wherein the first dopant provides either n-type doping or p-type doping in the first graphene layer, and wherein the second dopant provides, in the second graphene layer, doping of a type opposite to the type of doping provided by the first dopant, whereby the semiconductor device of claim 1 is obtained.

* * * * *